United States Patent [19]

Bulatao

[11] 4,445,086
[45] Apr. 24, 1984

[54] MULTICONDUCTOR CABLE TESTER

[75] Inventor: Jose G. Bulatao, Santa Clara, Calif.

[73] Assignee: The Boeing Company, Seattle, Wash.

[21] Appl. No.: 350,426

[22] Filed: Feb. 22, 1982

[51] Int. Cl.³ .......................................... G01R 19/00
[52] U.S. Cl. .................................................. 324/66
[58] Field of Search ........................... 324/66, 51, 52; 179/175.3 A

[56] References Cited

U.S. PATENT DOCUMENTS

| | | |
|---|---|---|
| 3,252,088 | 5/1966 | Palmer . |
| 3,287,509 | 11/1966 | Bohnenblust . |
| 3,288,943 | 11/1966 | Bohnenblust . |
| 3,288,945 | 11/1966 | McNair . |
| 3,401,238 | 9/1968 | Williams . |
| 3,427,538 | 2/1969 | Bohnenblust . |
| 3,476,888 | 11/1969 | Rollins . |
| 3,514,552 | 5/1970 | Smith . |
| 3,559,055 | 1/1971 | Thompson . |
| 3,600,673 | 8/1971 | Kohke . |
| 3,644,687 | 2/1972 | Richards . |
| 3,681,686 | 8/1972 | Connally . |
| 3,699,438 | 10/1982 | Webb . |
| 3,728,616 | 3/1973 | Cheek ........................ 324/66 X |
| 3,740,644 | 6/1973 | Schag . |
| 3,742,350 | 6/1973 | White . |
| 3,867,692 | 2/1975 | Esch ............................. 324/66 |
| 3,891,811 | 6/1975 | Miller . |
| 3,902,026 | 8/1975 | Rogers . |
| 3,976,939 | 8/1976 | Cruce . |
| 3,986,106 | 10/1976 | Shuck . |
| 4,030,029 | 6/1977 | Cox . |
| 4,074,187 | 2/1978 | Miller . |
| 4,257,002 | 3/1981 | Helms . |

FOREIGN PATENT DOCUMENTS

| | | | |
|---|---|---|---|
| 2626727 | 12/1977 | Fed. Rep. of Germany . | |
| 55-122169 | 9/1980 | Japan .......................... | 324/66 |
| 2062317 | 5/1981 | United Kingdom .......... | 324/66 |
| 197709 | 3/1961 | U.S.S.R. ....................... | 324/66 |

Primary Examiner—Stanley T. Krawczewicz
Assistant Examiner—Jose M. Solis
Attorney, Agent, or Firm—Thomas H. Olson; J. Peter Mohn

[57] ABSTRACT

A tester for conductors in a multiconductor cable which afford identification of the respective ends of each pair and tests each pair for shorts and opens. A transmitter unit for connection to one terminus of the cable and a receiver unit for connection to the opposite terminus of the cable. The transmitter has a plurality of integrated circuits forming a sequencer to apply in sequence a test signal to one end of each of the conductors. The transmitter has a power supply and there is a connection over a conductive path independent of the cable to connect the power supply to the receiver whereby the receiver is extremely compact. The receiver contains a plurality of light emitting diodes that constitute signal detectors, there being one detector for each conductor. The transmitter is supplied with controls for controlling the mode of operation of the equipment and for affording variation in the number of conductors that can be tested. The receiver contains an actuator so that certain operational modes of the transmitter can be controlled from the receiver.

10 Claims, 4 Drawing Figures

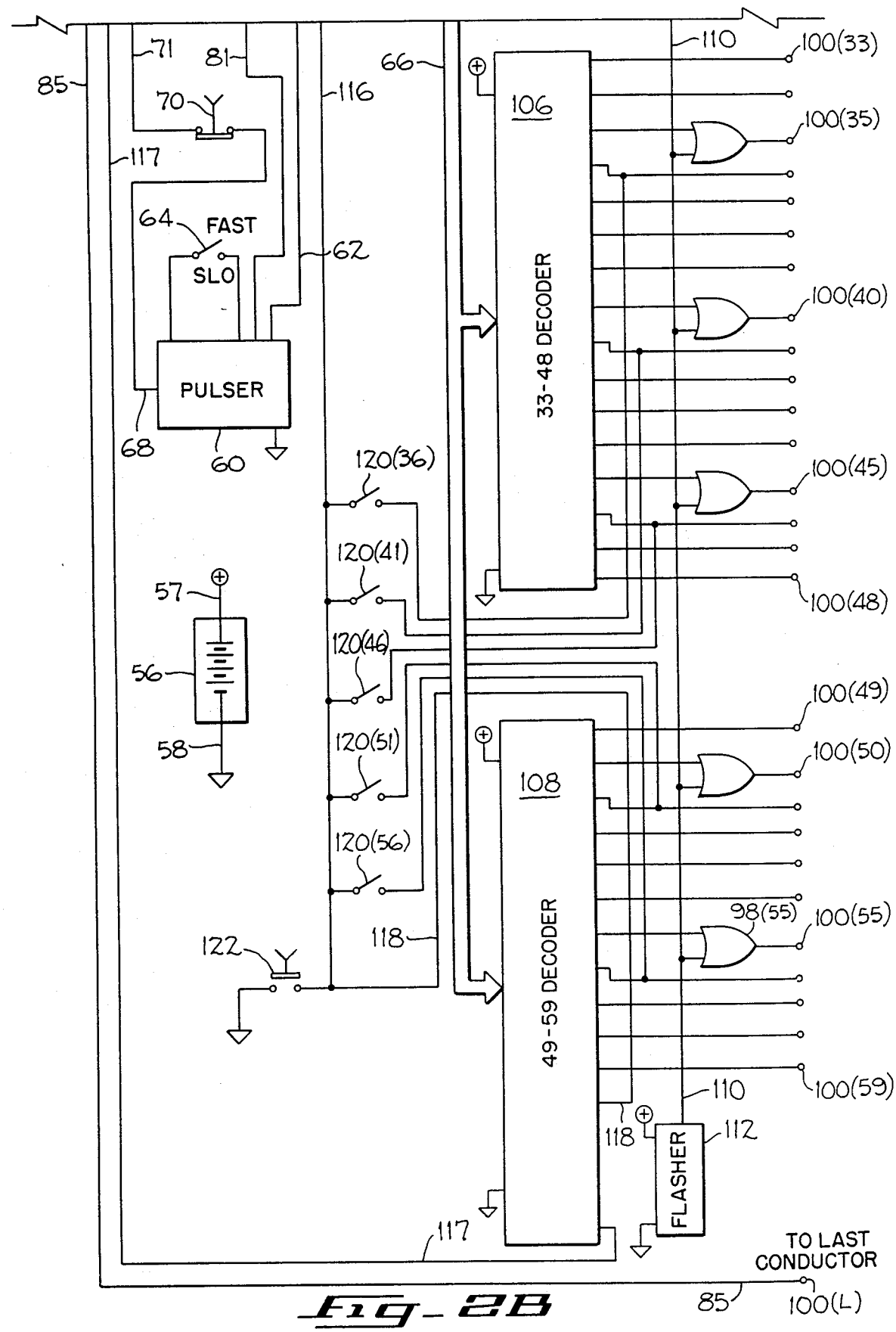
Fig_2B

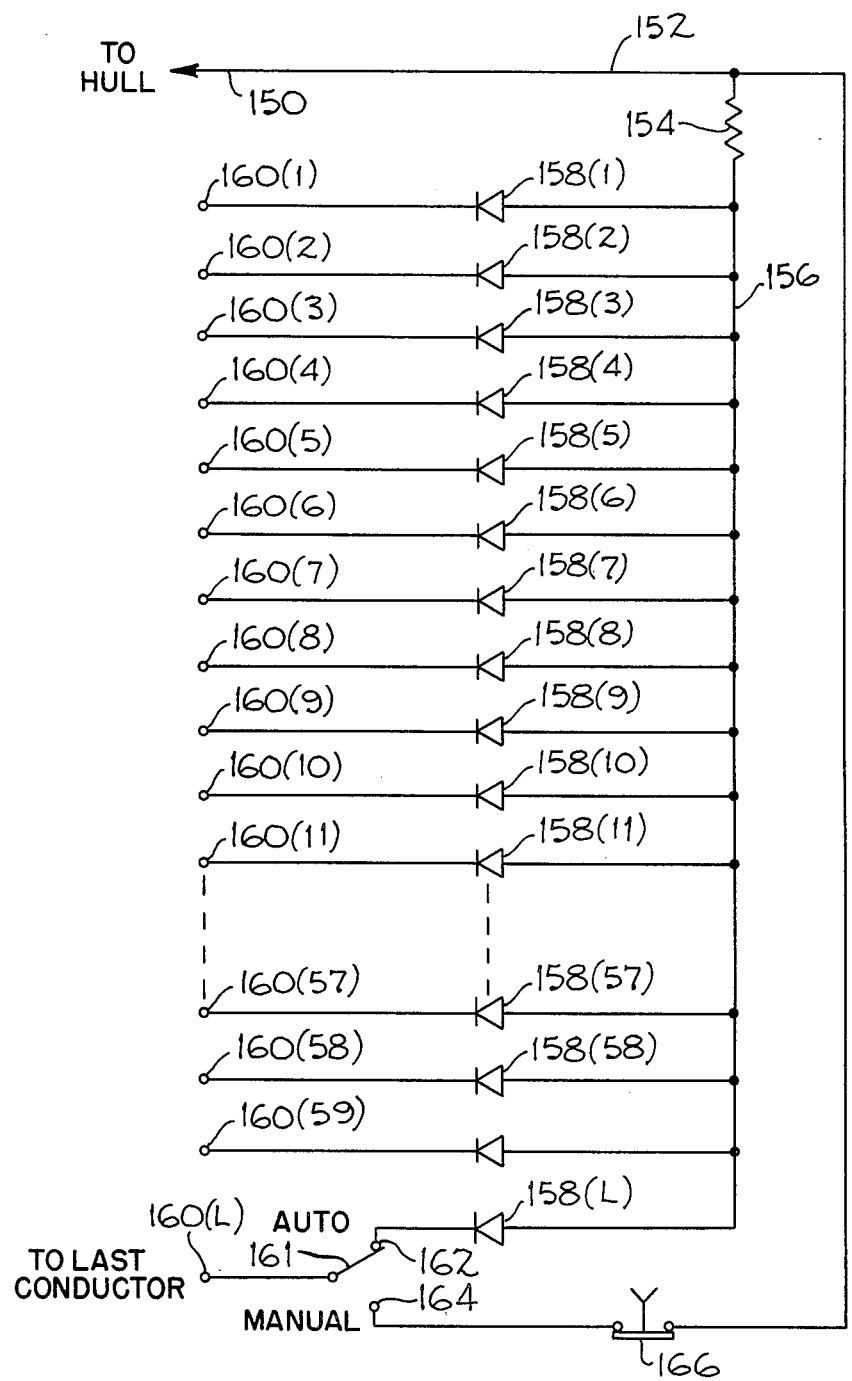

MULTICONDUCTOR CABLE TESTER

BACKGROUND OF THE INVENTION

1. Field of the Invention

This invention relates to apparatus for identifying conductors in a multiconductor cable and for testing the conductors for shorts and continuity, and more particularly to such apparatus for testing the cable after it is installed in a vessel or like environment in which the ends of the cable are remote from one another.

2. Description of the Prior Art

The known prior art is replete with systems for testing conductors in a multiconductor cable and for identifying opposite ends of each conductor or conductor pair.

One general scheme disclosed in the prior art employs an electronic or electromechanical stepper to apply a test signal to each conductor in a multiconductor cable at the central office end of the cable. A remote unit supplied with a counter or a signal detector responds to a signal received on one conductor to identify the conductor and/or test the conductor. Exemplifying such scheme are the following U.S. Pat. Nos. 3,252,088; 3,287,509; 3,288,943; 3,476,888; 3,740,644; 3,742,350; 3,891,811; 3,976,939 and 3,986,106.

Another category of prior art testing apparatus includes two units, one of which is connected to each end of a cable. Each of the units has a counter and the counters are synchronized with one another through a spare conductor in the cable. Accordingly, the counters cycle through all conductors in synchronism and afford identification of opposite ends of the conductors and in some cases testing of the electrical condition of the conductors. Exemplifying this prior art system are U.S. Pat. Nos. 3,288,945; 3,427,538 and 3,514,552.

Still another form of prior art cable testing apparatus employs a sequencer at one end which applies a test signal to the cable conductors in sequence, a circuit having a probe adapted for connection to a single conductor at the other end of the cable and an interconnection so that when the conductor to which the probe is connected is addressed by the sequencer, the sequencer is automatically stopped until the conductor can be tagged or otherwise identified. Exemplifying this type of equipment are U.S. Pat. Nos. 3,401,238; 3,559,055; 3,681,686 and 3,699,438.

The prior art also discloses various circuits for testing individual conductors in a wiring harness. These systems are not applicable to testing cables in which the ends of the cables are remote from one another. Harness testing systems are disclosed in U.S. Pat. Nos. 3,600,673; 4,030,029 and 4,257,002.

U.S. Pat. No. 3,644,687 discloses a system in which there is a central office stepper capable of applying a test signal to each cable conductor in turn and a remotely located field unit which enables the user to advance the stepper at will. The stepper puts an audio tone on the conductor to which it is connected and the tone is located by a probe at the remote location.

U.S. Pat. No. 3,902,026 discloses a sophisticated system employing a random access memory at one end of the cable. Coded pulses indicative of the conductor number are transmitted from a remote end of the cable, and the coded pulses are stored at an address in the random access memory that corresponds to the position of the cable termination on a terminal board associated with the random access memory.

U.S. Pat. No. 4,074,187 discloses a cable tester having a plurality of light emitting diodes (LEDS) which are included in a circuit such that the number and identity of LEDS that are illuminated provide an indication whether the conductor to which the system is connected is shorted, open, grounded or trouble-free.

German Offenlegungsschrift 26 26 727 discloses a cable tester having a pulse generator constructed from integrated circuit TTL logic modules arranged in a shift register so that a test signal can be applied to each conductor in turn. There is a receiving unit having an LED connected to each conductor so that the identity of the LED that is illuminated provides identification of a particular conductor.

SUMMARY OF THE INVENTION

In the embodiments of the invention that are described in more detail hereinafter there is a transmitter unit adapted for connection to one end or terminus of a cable under test and a receiver unit adapted for connection to the opposite end or terminus of the cable. Each unit is provided with a plurality of connectors sufficient in number that there is one connector in each unit for each conductor in the multiconductor cable. In circuit with each connector in the receiving unit is a detector so that the condition of each individual conductor in the cable can be detected. The transmitter unit includes a sequencer which applies a test signal on each conductor connected thereto in order, so that at any given time only one conductor has a test signal applied thereto. If a conductor to which a test signal is applied by the sequencer is a good conductor, i.e., is not shorted to another conductor and is not open, one and only one detector in the receiver unit is activated. A shorted conductor is manifested by excitation of two or more detectors in the receiver unit and an open conductor is manifested by excitation of no detectors in the receiver unit. The sequencer runs at a constant repetition rate so that a user having access to the receiver can predict the time when each detector should be excited.

When the tester of the invention is employed in testing ribbon cables, test procedures are expedited because each individual conductor can be identified at both ends of the cable. When the tester is used with a sheathed cable in which the individual conductors can not be identified, visually however, it is customary to first tag the individual conductors so that each one can be identified at both ends. To facilitate tagging the conductors, the sequencer is arranged to provide a unique test signal for one or more of the conductors so that the other conductors can be arranged with reference to the conductor with the unique test signal. The unique signal can be in the form of a pulsating or flashing test signal as compared to the remaining signals which are steady-state signals.

Facilitating efficient tagging and testing of the conductors is the fact that the detectors in the receiving unit are arranged in a spatial array that affords visual correlation between each individual detector and a specific connector on the receiver unit. The array can be a linear array, a circular array or any other suitable regular pattern that enables the user to anticipate which detector should be excited at any given time.

The transmitter unit is provided with a control that permits connection to a single connector and conductor a steady-state signal so that such conductor can be identified and appropriately connected to the receiver unit. After identification of such conductor at the receiver unit, the control permits the transmitter unit to be switched to a sequencing mode so that a test signal is applied in sequence to each conductor as described above.

A cable tester according to the invention is typically employed on cables that are installed in a conductive environment such as a ship's hull. The hull is used as a return path between the receiver unit and the transmitter unit. In environments where the vessel in which the cable is installed is of non-conductive material, a return conductor separate from the cable can be employed between the units.

One embodiment of the invention is designed for use with cables that have up to sixty individual conductors. Such unit has a bank of switches which permit reduction in multiples of five of the total number of conductors to be tested. Accordingly, such unit is useful in testing any size cable up to some maximum number, sixty in the present example.

The foregoing, together with other objects, features and advatages of the invention, will be more apparent after referring to the following specification and the accompanying drawings.

BRIEF DESCRIPTION OF THE DRAWINGS

FIGS. 2A and 2B constitute a schematic diagram of a transmitter unit illustrating another embodiment of the invention.

FIG. 3 is a schematic view of a receiver unit for use with the transmitter unit of FIG. 2.

DETAILED DESCRIPTION OF THE PREFERRED EMBODIMENTS

Figure 1:
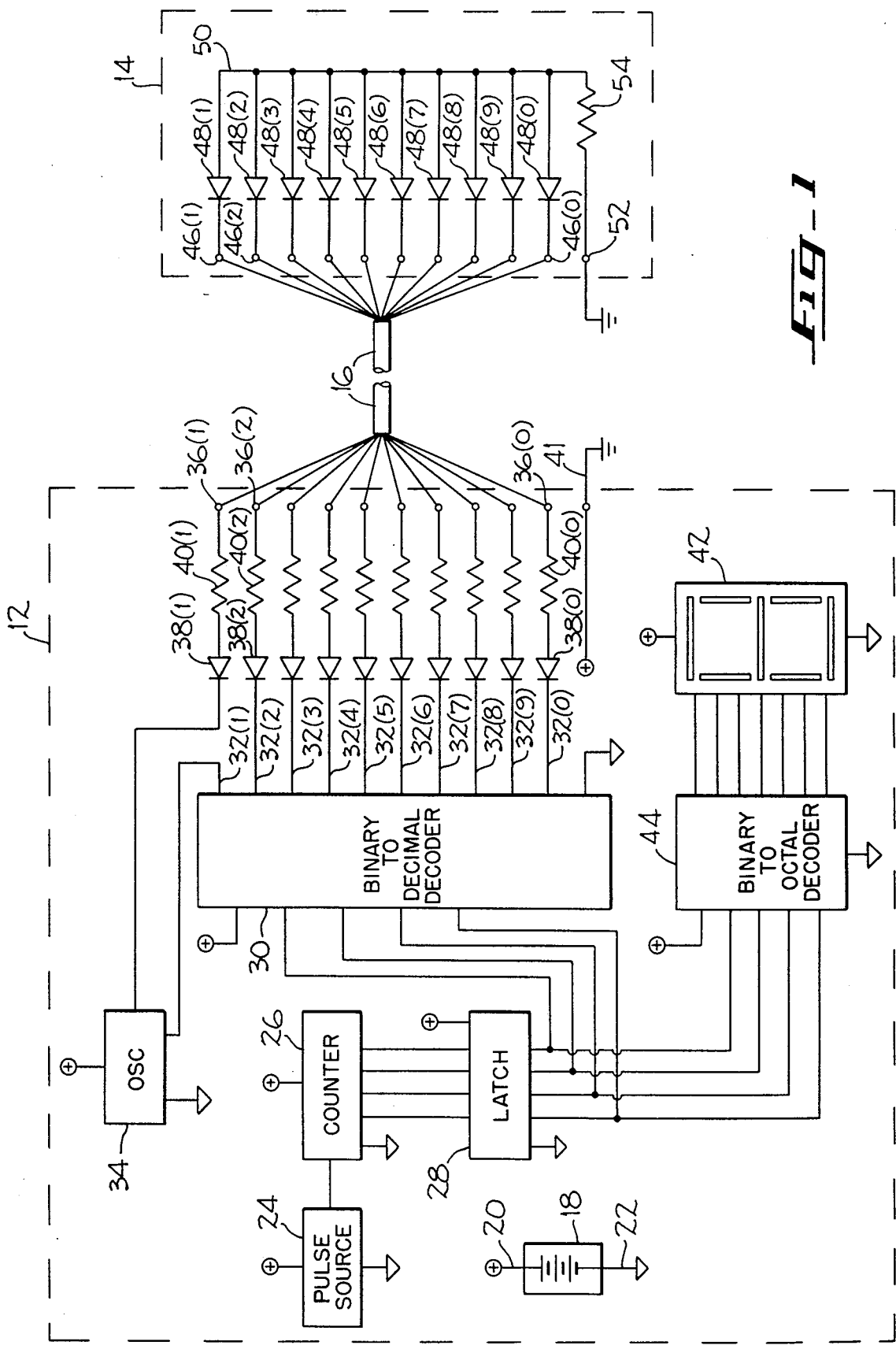
FIG. 1 is a partially schematic diagram of one embodiment of the invention showing a receiving unit and a transmitting unit.

Referring more particularly to FIG. 1 of the drawings, reference numeral 12 indicates a transmitter unit and reference numeral 14 indicates a receiver unit. The units 12 and 14 are connected to opposite ends or termini of a multiconductor cable 16. Transmitter unit is composed of an active circuit powered by a power source 18, for example a dry battery, which has a positive output 20 and a negative output 22. To simplify the schematic diagram of FIG. 1, the connections to positive power terminal 20 are indicated by an encircled plus sign and connection to the negative output are indicated by an inverted triangle. As can be seen in FIG. 1, power is connected to each of the elements within the transmitter unit. One of the elements is a pulse source 24 that produces a series of recurring timing pulses at a rate slow enough to be visually perceptable but fast enough to permit the user of the device to check all conductors in cable 16 in a brief period. A suitable repetition rate for the pulses produced by source 24 is thirty pulses per minute, or one pulse every two seconds. The output of pulse source 24 is connected to a digital counter 26 which in this embodiment is a decade counter. The binary outputs of counter 26 are connected to corresponding inputs of a latch 28 which has outputs on which occurs a binary number that remains constant until changed by a succeeding pulse from pulse source 24. The binary outputs of latch 28 are connected to the binary inputs of a decoder 30. Decoder 30 receives the binary output from latch 28 at its inputs and applies a test signal to one of ten outputs. The outputs of decoder 30 are indicated by reference numeral 32 followed by a cardinal number enclosed in parentheses. Thus the outputs are identified as 32(1) to 32(0). Outputs 32 of encoder 30 are excited sequentially during operation of the apparatus.

In one system designed in accordance with the invention, decoder 30 is embodied in a TTL integrated circuit chip no. 7442. Such integrated circuit operates so that the addressed output 32 is at a potential of zero volts and all other outputs are at +5 volts.

Output 32(1) is connected to an oscillator 34 which produces a signal at a frequency greater than that produced by pulse source 24 but low enough to be visually perceptable. A frequency of about five cycles per second is suitable. The output of oscillator 34 is connected to output connector 36(1) through a light emitting diode (LED) 38(1) and a current limiting resistor 40(1).

Outputs 32(2) through 32(0) of decoder 30 are connected to respective connectors 36(2) through 36(0) by way of diodes 38(2) through 38(0) and series resistors 40(2) through 40(0). Connectors 36 can be considered transmitter connectors to which test signals are sequentially applied from decoder 30 through LEDS 38 and current limiting resistors 40.

There is an output 41 in the form of clip lead that can be connected to the hull of the vessel in which cable 16 is installed. Internally of transmitter 12, clip lead output 41 is connected to the positive terminal 20 of power source 18.

Transmitter connectors 36 and LEDS 38 are arranged in arrays that are spatially correlated with one another so that illumination of one of the LEDS affords a visual indication of which connector 36 is excited at any given time.

Also providing a visual indication of which connector 36 has a test signal applied thereto is a seven segment LED numeric display 42 the individual elements of which are appropriately excited by a binary tc octal decoder 44, which receives its inputs from latch 28. Thus during operation of the transmitter, display 42 affords a visual indication of which output connector is excited by a test signal from decoder 30 and LEDS 38 afford a similar indication if, as will be subsequently explained, a circuit through the particular LED is completed.

Transmitter connectors 36 can be in the form of screw terminals, test leads or the like so as to provide for connection to the respective transmitter terminals of the individual conductors of cable 16 at one terminus of the cable. The conductors at the opposite terminus of the cable are connected to receiver connectors 46(1) through 46(0). Receiver connectors 46, as can be seen in FIG. 1, are arranged in an array corresponding to the array formed by transmitter connectors 36 so that visual correlation and identification of the respective conductors in cable 16 is afforded. Connected to each receiver connector 46 is a signal detector, exemplified in FIG. 1 as an LED. There is an LED 48(1) associated with receiver connector 46(1), an LED 48(2) associated with receiver connector 46(2) and so on. It will be noted that detectors 48 are in a spatial array corresponding to the array in which receiver connectors 46 are disposed so as to afford visual correlation between the detectors, the connectors, and the cable conductors connected to the connectors. The opposite terminals of detectors 48 are connected to a common circuit path 50, which is connected to a common receiver connector 52 through a current limiting resistor 54. Connected to common receiver connector 52 is a clip lead which affords common electrical connection to the metal hull of the vessel in which the cable is installed so as to form with transmitter clip lead 41 an electrical return circuit path.

The operation of the embodiment shown in FIG. 1 will first be described in connection with a test of a ribbon cable in which identification of a given conductor at either terminus can be visually ascertained and then in connection with a sheathed cable in which there is no visual correspondence between opposite termini of the cable. After the cable has been installed in the hull of a vessel, it is customary to test the integrity of the cable before any connections are made at either terminus thereof. In using the present invention for performing such test on a flat or ribbon cable, the individual conductors, starting at the conductor at one lateral extremity of the ribbon cable, are connected to transmitter connectors 36(1) through 36(0). At the opposite terminus of the cable, corresponding conductors are connected to receiver connectors 46(1) throught 46(0). At the first terminus ground clip 41 is connected to the vessel hull and at the second terminus ground clip 52 is similarly connected to the vessel hull to establish a return path between transmitter unit 12 and receiver unit 14. Next the circuit elements in the transmitter unit are energized so that pulse source 24 produces a series of regularly recurring pulses. Through counter 26, latch 28 and decoder 30 test signals are applied sequentially to the cable conductors connected to transmitter connectors 36(1) through 36(0). In one circuit designed in accordance with the embodiment of FIG. 1, decoder outputs 32 float at +5 volts and the test signal is constituted by applying to a decoder output a ground potential for a duration of about two seconds. If it is assumed that such test signal is applied to decoder output 32(2), it is seen that current is caused to flow through diode 38(2) and diode 48(2). Illumination of the diodes signifies that the cable conductor connected between transmitter connector 36(2) and receiver connector 46(2) is continuous. If the last named diodes are the only ones that are illuminated, this indicates that the associated conductor is not shorted to any other conductor. If there is a short, however, one of the other diodes in transmitter 12 and/or receiver 14 will be illuminated. The two second interval of the pulses produced by pulse source 24 provides adequate time for an experienced operator to observe the LEDS and ascertain the condition of the cable. Moreover, the fact that the LEDS are disposed in an organized array facilitates rapid ascertainment of the condition of each individual cable conductor.

After the last conductor, the one connected between transmitter connector 36(0) and receiver connector 46(0) has been tested, decoder 30 functions to apply a test signal to output 32(1). This test signal energizes oscillator 34 which applies to the conductor connected to transmitter connector 36(1) a flashing signal which is manifested by LED 38(1) to apprise the operator that the system has started a new test cycle. Thus the operator can discontinue testing if previous cycles have indicated no cable troubles or can permit the tester to go through another cycle of operation.

The presence of oscillator 34 and its association with a specific connector, connector 36(1), is of substantial assistance in tagging and testing sheathed cables in which individual conductors at opposite termini cannot be visually distinguished. In using the apparatus to test such cables, the conductors at the two termini are connected as described previously except that in this case there will be no correlation between the sequence of the conductors at opposite termini. In this instance the presence of a flashing signal on conductor 36(1) will facilitate identification of the corresponding conductor at receiver 14 since one of the diodes 48 will produce a flashing signal. In typical operation of the system, the conductors connected to receiver connectors 46(1) will be switched around so that the conductor connected at one end to transmitter connector 36(1) will be connected at the other end to receiver connector 46(1). As the test signals are sequentially applied by decoder 30 to the various conductors, the pattern of illumination of LEDS 48 in receiver 14 will enable the operator to switch the conductors around on receiver conductors 46 so that in a short time the order of connection of conductors at both ends will be the same. At this time the conductors can be individually tagged and their continuity and freedom from shorts with other conductors can be ascertained.

Figure 2A:
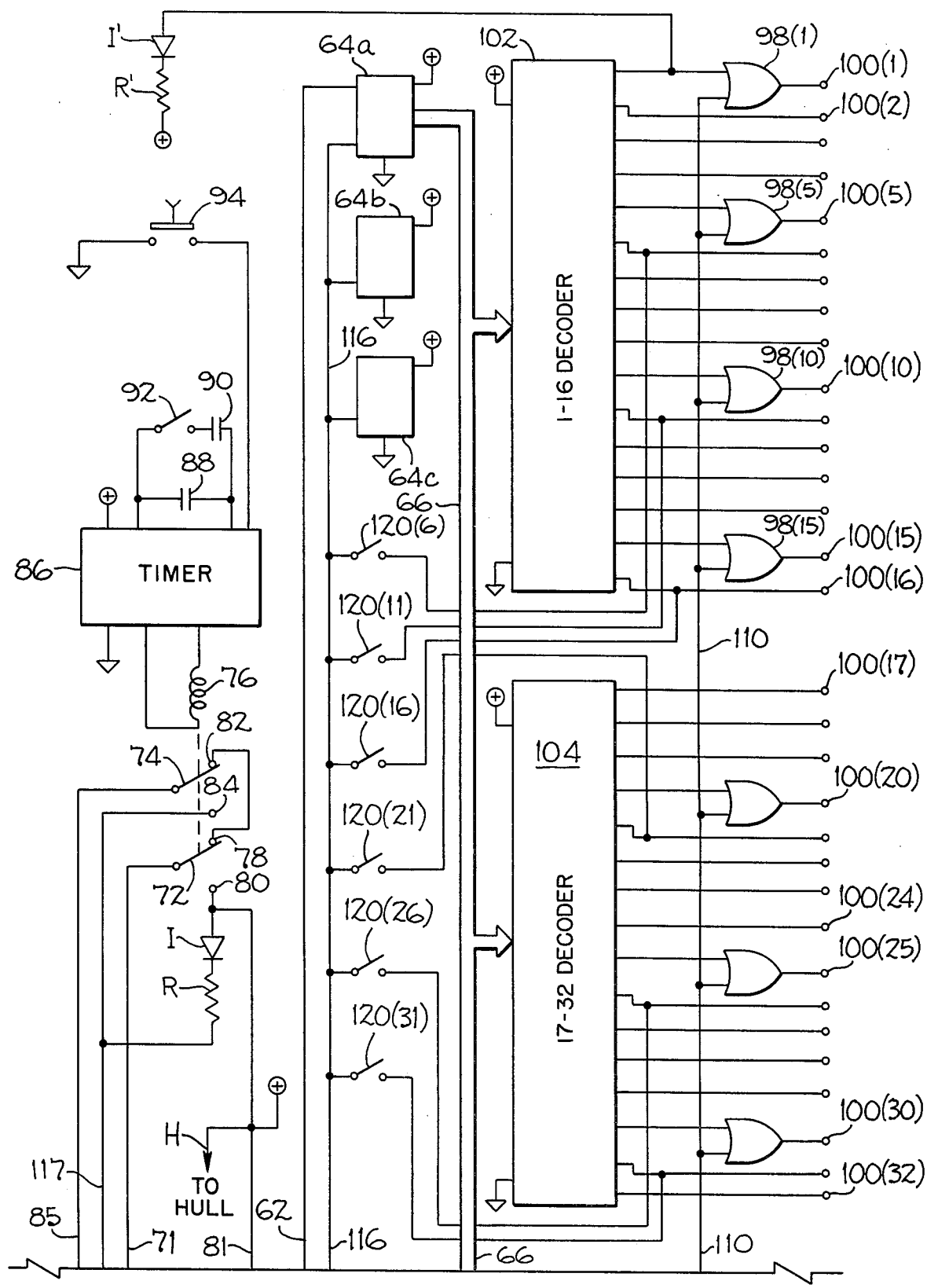

Referring now to FIGS. 2A, 2B and 3 there is shown a circuit embodying the invention which is suitable for relatively large multiconductor cables and has several operating features that facilitates use of the apparatus. FIGS. 2A and 2B depict the transmitter portion and FIG. 3 depicts the receiver portion. As seen in FIG. 2B there is a power source 56 exemplified as a battery, which has a positive output 57 and a negative output 58. As in FIG. 1, connections to positive power terminal 57 are indicated by an encircled plus sign and connections to the negative power terminal are indicated by an inverted triangle.

In FIG. 2B is shown a pulser 60 which corresponds in function to pulse source 24 shown in FIG. 1. Pulser 60 produces a series of regularly recurring pulses on its output 62, the repetition rate of the pulses being controlled by a range switch 64. In one exemplary system designed in accordance with the invention, pulser 60 is constructed so when that range switch 64 is open, the pulser produces a relatively high rate at about 15 pulses per second and when switch 64 is closed, a relatively low rate at about one pulse per second. The pulses produced on output 62 constitute the input of a six bit counter (FIG. 2A) composed of appropriately interconnected dual flip-flops 64a, 64b and 64c, which have outputs that drive a six bit bus 66 thereby affording binary signals having sixty-four unique states.

Pulser 60 also has a disable terminal 68. In one circuit designed in accordance with the present invention, wherein pulser 60 is adapted to be powered by a +5 volt potential, disable terminal when connected to positive power terminal 57 disables the pulse generator and when permitted to float enables the pulser to operate. Disable terminal 68 is connected through a normally closed push-button switch 70 and a circuit path 71 to a lower moving contact 72 (FIG. 2A) of a relay that includes an upper moving contact 74 and a coil 76. Associated with moving contact 72 is a normally closed fixed contact 78 and a normally open fixed contact 80. A circuit path 81 is connected to contact 80; circuit path 81 extends to positive power terminal 57 and to pulser 60. Also connected to path 81 is a clip lead H to afford connection of the positive power terminal to the hull. In addition, there is associated with fixed contact 80, an LED indicator I and a dropping resistor R which signal the user that the counter constituted by dual flip-flops 64a, 64b and 64c has been reset. Associated with moving contact 74 is a normally closed fixed contact 82 and a normally open fixed contact 84. A circuit path 85 is connected to moving contact 74. Fixed relay contacts 82 and 78 are connected to one another.

Relay coil 76 is connected to and energized by a timer 86. Timer 86 can be a monostable-multivibrator which produces an output pulse having a duration dictated by the capacitance of one or more timing capacitors. There is a timing capacitor 88 which establishes the output pulse of timer 86 at a relatively short duration, e.g., 1 minute. A second timing capacitor 90 is connected in series with a switch 92; when the switch is closed, capacitor 90 is connected in shunt with capacitor 88 and establishes a pulse output from timer 86 having a relatively long duration, e.g., 5 minutes. Timer 86 is triggered by closure of a normally open push button switch 94 which can be connected to a suitable potential, such as negative power terminal 58, so that when the switch is depressed, timer 86 produces an output pulse having a duration governed by the position of switch 92.

There is a total of fifty-nine transmitter output connectors, and they are identified by the reference character 100 followed by a number in parentheses indicating the sequence in which the transmitter connectors are supplied with a test signal. For applying the test signal to transmitter connectors 100 in sequence there are four identical decoders 102, 104, 106 and 108. The decoders are preferably embodied in integrated circuit chips. The decoders receive the six bit binary signal from bus 66 and decode it such that each of the output connectors 100 is supplied with a test signal in turn. In the embodiment of the invention shown in FIGS. 2A and 2B, a test signal on an output of one of the decoders is constituted by ground potential; absence of a test signal on an output is a signal that floats at about +5 volts. Decoder 102 drives transmitter connectors 100(1)–100(16), decoder 104 drives transmitter connectors 100(17)–100(32), decoder 106 drives transmitter connectors 100(33)–100(48), and decoder 108 drives transmitter connectors 100(49)–100(59). Because this embodiment of the invention is adapted for testing cables having sixty or less conductors, the outputs of decoder 108 corresponding to those following transmitter connector 100(59) are not used.

Associated with every fifth output connector 100 is an OR gate corresponding to OR gate 98(1). Thus there is an OR gate 98(5) associated with output connector 100(5), an OR gate 98(10) associated with output connector 100(10), an OR gate 98(15) associated with output connector 100(15), an so on, to OR gate 98(55) associated with output connector 100(55). Each of the OR gates has two inputs, one of which is connected to a respective output of decoders 102–108 and the other which is connected to a flasher bus 110. Bus 110 is driven by a flasher circuit 112 (FIG. 2B) which produces a continuous series of pulses at a visually perceivable repetition rate. As will appear in the subsequent description of the operation of the circuit of FIGS. 2A and 2B, application of a flasher signal on flasher bus 110 to every fifth conductor of the cable under test facilitates identification of the individual conductors.

The six bit counter formed by dual flip-flops 64a, 64b and 64c has a reset terminal to which a reset conductor 116 is connected. Application of an appropriate signal to the reset conductor resets the counter to its initial state, a state in which a test signal appears on a circuit path 117 which is connected to the last output of decoder 108. Resetting at the end of fifty-nine counts occurs by virtue of a permanent circuit connection 118 from the sixtieth output of decoder 108 to reset conductor 116. There is a plurality of switches for effecting reset at lower count when testing cables having a number of conductors less than sixty. For example, there is a switch 120(56) which effects reset when the fifty-sixth count on decoder 108 occurs. There are similar switches identified in FIGS. 2A and 2B by reference character 120 followed by a number in parentheses indicating the count at which reset occurs when the respective switch is closed. There is also a normally open reset push button switch 122 which permits manual resetting of the counter at any time.

Referring to FIG. 3, which shows a receiver unit adapted for use with the transmitter unit shown in FIGS. 2A and 2B, there is a clip lead 150 adapted for connection to the hull of the vessel in which the cable is installed so as to establish a common circuit with clip lead H shown in FIG. 2A. Connector 150 is connected to a common circuit path 152. In the specific embodiment here described common path 152 has a potential of +5 volts thereon. Connected to common circuit path 152 is one terminal of a current limiting resistor 154, the opposite terminal of which is connected to a common test return path 156. Test return path 156 has connected to it the anode terminals of a plurality of light emitting diodes designated by reference numeral 158 followed by a parenthetical reference to a cardinal number representative of a specific conductor under test. Thus there is a diode 158(1) adapted for connection to the first conductor under test, a diode 158(2) adapted for connection to the second conductor under test, and so on to a diode 158(L) representative of the last conductor of the cable under test. In the specific embodiment under description there is a total of fifty-nine light emitting diodes 158 but because they are virtually identical in structure and function only a limited number is shown in FIG. 3. The cathode of each light emitting diode 158 is connected to a receiver connector designated by reference character 160 followed by a parenthetic cardinal number representative of an individual conductor in the cable under test. Receiver connectors can be screw terminals, clip leads or the like.

There is a connector 160(L) which is adapted for connection to the last conductor of the cable under test. Connector 160(L) is connected to the moving contact 161 of a single-pole, double-throw switch having fixed contacts 162 and 164. As indicated in FIG. 3 when moving contact 161 is in contact with fixed contact 162, the system operates in an automatic mode and when the moving contact is in contact with fixed contact 164 the system operates in a manual mode. In series between fixed contact 164 and common circuit path 152 is a normally closed push button switch 166.

The operation of the system as embodied in FIGS. 2A, 2B and 3 will now be described. After the cable to be tested has been installed in its final position in a hull of a vessel, the transmitter of FIGS. 2A and 2B is connected to one end of the cable by connecting the end of the cable conductors to respective connectors 100. The conductors connected to connectors 100(1) and 100(L) can be arbitrarily considered the first conductor and the last conductor, respectively, or in the case where the conductors are physically distinct the conductors can be connected in an order dictated by the physical distinctions. It will first be assumed that the cable to be tested has sixty conductors in consequence of which all switches 120 are maintained in the open position. Additionally, clip lead H is connected to the hull of the vessel or like common conductive part. After connections to the transmitter as described next above have been completed, switch 92 is closed to establish the interval produced by timer 86 at a relatively long interval and push button switch 94 is momentarily depressed so as to trigger the timer. Triggering timer 86 energizes relay coil 76 so that moving contacts 72 and 74 are moved to the downward position, the position different from that shown in FIG. 2A. Reset push button 122 is depressed, which has the effect of applying to bus 66 a binary signal that causes the last output of decoder 108 to apply a signal at a potential of zero volts to be applied to circuit path 117. Because relay coil 76 is energized, the zero volt signal on circuit path 117 is coupled through relay contacts 84 and 74 and conductor 85 to connector 100(L) and the cable conductor connected thereto.

Next the receiver of FIG. 3 is connected at the opposite terminus of the cable. The connection is established by connecting connector 150 to the hull or other common conducting path and by connecting the individual cable conductors to receiver connectors 160. If the conductors are physically distinct from one another, they can be connected in order; if they are not, they can be connected initially in a random order and subsequently changed until their order corresponds with that at the transmitter. While relay coil 76 is energized, one LED 158 will have a steady-state signal so that it is illuminated without flashing, because of the steady-state zero volt signal applied to transmitter connector 100(L) and the cable conductor connected to it. The opposite end of such conductor can be transferred to receiver connector 160(L), whereby both ends of the last conductor are identified and properly connected.

Moving contact 161 of the selector switch in the receiver is thrown so that the moving contact moves into contact with fixed contact 164 thereby affording subsequent manual stepping of the transmitter via the last conductor. After timer 86 times out, relay coil 76 is de-energized so that moving relay contacts 72 and 74 assume the position shown in FIG. 2A. In such condition the closure of moving relay contact 74 with fixed relay contact 82 and of moving relay contact 72 with fixed relay contact 78 establishes a circuit between push button switch 166 in the receiver over the last conductor connected between connectors 160(L) and 100(L), circuit path 71 and normally closed push button switch 70 to disable terminal 68 of pulser 60. This condition inhibits operation of pulser 60. Momentary actuation of push button switch 166 removes the disabling signal so that the pulser 60 can produce one pulse and cause the counter formed by dual flip-flops 64a, 64b and 64c to advance one step. This causes application of a test signal from decoder 102 to one of the inputs of OR gate 98(1) and a subsequent actuation of push button switch 166 causes decoder 102 to apply an output signal to connector 100(2). Such test signal is at a potential of zero volts so that the particular receiver LED 158 that is illuminated corresponds to the particular connector 160 to which the second end of the conductor connected to transmitter connector 100(2) is connected. If LED 158(2) is the LED that is illuminated, such indicates that the second end of the conductor has been properly identified. Contrariwise, if some other LED 158 is illuminated, the operator is apprised that such conductor should be exchanged with the conductor connected to receiver connector 160(2).

The above described procedure is repeated by a series of momentary actuations of push button switch 166 until the second ends of all conductors are connected to receiver connectors 160 in a sequence corresponding to that of the first ends of the conductors connected to transmitter connectors 100. At this stage, the operator can operate the mode switch to a position at which moving contact 161 is in contact with fixed contact 162. In such circuit position, a test signal will be applied sequentially to the cable conductors via decoders 102–108 at a rate dictated by the rate of the pulses produced by pulser 60.

As the system automatically sequences through each conductor, the presence of OR gates 98 and their cooperation with flasher 112 causes a flashing LED 158 to occur for every fifth conductor. This provides a visual indication to the operator of the progress of a count through the sequence. A properly terminated cable without shorts or opens will be manifested by individual sequential illumination of all diodes 158. Because pulser 60 can operate at either a relatively high rate or a relatively low rate the operator can select a rate suitable to ambient conditions. The connection by circuit path 118 from the sixtieth output of decoder 108 to reset conductor 116 causes the sequence to repeat continuously until interrupted by the operator.

In identifying and testing cables having fewer than 60 conductors, an appropriate switch 120 is closed. By way of example, if a forty conductor cable is to be tested, switch 120(41) is closed and operation proceeds as described above except that after forty counts a reset signal is supplied from the firty-first output terminal of decoder 106 to reset conductor 116 in consequence of which the sequencing is terminated after forty counts and starts at the last connector 100(L) and then the first and succeeding connectors.

Thus it will be seen that the present invention provides a highly efficient, portable and relatively uncomplex apparatus for testing cables. Because power is supplied to the receiver through the hull and because control is effected through the last conductor, the receiver can be extremely compact thereby facilitating its use in restricted places. Moreover, because the system is embodied in solid-state integrated circuits, it is inexpensive to produce and highly reliable in operation.

Although two embodiments of the invention have been shown and described, it will be obvious that other adaptations and modifications can be made without departing from the true spirit and scope of the invention.

What is claimed is:

1. Apparatus for testing for shorts and continuity in a multiconductor cable having a first terminus and a second terminus remote from the first terminus comprising a transmitter having plural transmitter connectors for effecting individual connection of every conductor at said first terminus, a receiver having plural receiver connectors for effecting individual connection of every conductor at said second terminus, means for establishing a common path between said transmitter and said receiver independent of the cable, a power source disposed in said transmitter for providing power thereto, said power source being connected to said common path for providing power to said receiver, said transmitter having a signal source for producing a test signal and sequencer means for applying the test signal in a sequence to respective said transmitter connectors at a predetermined repetition rate, said signal source including means for applying to a first transmitter connector a unique test signal different from the other test signals to afford identification of a conductor connected to said first transmitter connector, said receiver having a plurality of signal detectors for detecting said test signal and unique test signal, and means connecting each of said detectors to a respective one of said receiver connectors, said receiver having means for establishing a connection to said common path so as to be supplied with power from said power source in said transmitter thereby affording excitation of a detector associated with a receiver connector to which is connected a conductor having a test signal applied thereto by said transmitter, said detectors producing visually perceptible outputs and being disposed in said receiver in a spatial array to afford visual correlation with said receiver connectors and the conductors connected thereto.

2. Apparatus according to claim 1 wherein said transmitter includes a plurality of visually perceptible indicators, there being an individual indicator associated with each respective transmitter connector, said indicators being oriented in said transmitter in an array corresponding to the array of said detectors so as to afford visual correlation between said indicators and said detectors.

3. Apparatus according to claim 2 wherein said detectors and said indicators are light emitting diodes.

4. Apparatus according to claim 1 wherein said unique test signal applying means includes a flasher having an output coupled to said first transmitter connector for producing a pulsating signal at a repetition rate greater than the sequence rate at which the test signal is applied to said transmitter connectors by said test signal applying means, said repetition rate being sufficiently small that pulsations produced in said detectors by said flasher can be visually perceived.

5. Apparatus according to claim 1 including means for coupling said unique test signal to one of said transmitter connectors other than said first transmitter connector so that a conductor connected to said one transmitter connector can be distinguished at said receiver from conductors connected to the other connectors.

6. Apparatus according to claim 1 wherein said test signal applying means comprises a pulse generator for producing recurrent pulses at a period at least about two seconds in length, a pulse counter having an input connected to said pulse generator and an output for generating a range of binary numbers at least as large as the number of conductors in said cable, and a decoder having an input coupled to receive said binary numbers and a plurality of outputs at least as large as the number of conductors in the cable, said decoder being constructed and arranged to apply a test signal to a different output in response to each pulse produced by said pulse generator.

7. Apparatus according to claim 6 wherein said pulse counter includes means for resetting the output thereof to a binary number corresponding to the beginning of the sequence and means for selectively connecting one of said transmitter output connectors to said resetting means to afford resetting of said test signal applying means after counting through a portion of said sequence, whereby said apparatus can be employed for testing cable having a number of conductors less than the capacity of the range of binary numbers produced by said pulse counter.

8. Apparatus according to claim 1 wherein said transmitter includes a timer having an input and an output which produces a timing signal during a prescribed duration following excitation of said input, means for controllably exciting said input, switch means coupled to said output and having first circuit completing means closed in absence of said timing signal and second circuit completing means closed during presence of said timing signal, said first circuit completing means establishing a circuit from a last transmitter connector to said pulse generator for applying an inhibit signal to said pulse generator, said second circuit completing means establishing a circuit from said power source to said pulse generator for inhibiting said pulse generator, and wherein said receiver comprises a selector switch in circuit between said common connection establishing means and a last receiver connector corresponding to said last transmitter connector, said selector switch being switchable to a first position for affording selective inhibition of said pulse generator from said receiver through said first circuit closing means.

9. Apparatus according to claim 8 wherein said receiver includes a push button forming a circuit with said selector switch in said first position so as to afford momentary disconnection of said inhibit signal from said last receiver connector so as to permit said pulse generator to generate a single pulse.

10. Apparatus according to claim 8 wherein said selector switch is switchable to a second position, said second position including one of said detectors so as to afford testing of a conductor connected to last said receiver connector.

* * * * *